United States Patent
Huang et al.

(10) Patent No.: US 8,368,437 B2
(45) Date of Patent: Feb. 5, 2013

(54) PHASE LOCKED LOOP WITH CHARGE PUMP

(75) Inventors: Ming-Chieh Huang, San Jose, CA (US); Chih-Chang Lin, San Jose, CA (US); Tao Wen Chung, Zhubei (TW); Chan-Hong Chern, Palo Alto, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 125 days.

(21) Appl. No.: 13/039,095

(22) Filed: Mar. 2, 2011

(65) Prior Publication Data

US 2012/0223752 A1    Sep. 6, 2012

(51) Int. Cl.
*H03L 7/06* (2006.01)

(52) U.S. Cl. ........................................ 327/156; 327/147

(58) Field of Classification Search ................... 327/147, 327/156

See application file for complete search history.

(56) References Cited

U.S. PATENT DOCUMENTS

| | | | |
|---|---|---|---|
| 5,877,984 A * | 3/1999 | Engh | 365/185.19 |
| 6,700,447 B1 * | 3/2004 | Nilsson | 331/10 |
| 6,711,229 B1 * | 3/2004 | Harada | 375/376 |
| 7,053,727 B2 * | 5/2006 | Nilsson | 332/127 |
| 2004/0124938 A1 * | 7/2004 | Nilsson | 332/112 |
| 2012/0051480 A1 * | 3/2012 | Usugi et al. | 375/376 |
| 2012/0063546 A1 * | 3/2012 | Kobayashi | 375/316 |
| 2012/0194237 A1 * | 8/2012 | Hsiao et al. | 327/157 |

* cited by examiner

*Primary Examiner* — Adam Houston
(74) *Attorney, Agent, or Firm* — Lowe Hauptman Ham & Berner, LLP

(57) ABSTRACT

A phase locked loop (PLL) includes a voltage controlled oscillator (VCO) configured to supply an output signal. A phase frequency detector (PFD) is configured to receive a reference frequency signal and to provide a first control signal. A first charge pump is configured to receive the first control signal and to provide a first voltage signal in order to control the VCO. A second charge pump is configured to receive the first control signal and to provide a second voltage signal. A comparator is configured to receive a reference voltage signal, to compare the reference voltage signal and the second voltage signal, and to provide a second control signal. The PFD is configured to adjust at least one side slope of the first control signal based on the second control signal.

20 Claims, 5 Drawing Sheets

US 8,368,437 B2

PHASE LOCKED LOOP WITH CHARGE PUMP

TECHNICAL FIELD

The present disclosure relates generally to an integrated circuit and, more particularly to a phase locked loop.

BACKGROUND

A phase locked loop (PLL) for some applications, e.g., a high speed serializer-deserializer or an optical link transceiver, needs to have a low jitter. A random jitter in the PLL mainly comes from a voltage controlled oscillator (VCO). On the other hand, the charge pump coupled to the VCO in the PLL is one of the major sources of a deterministic jitter. A PLL circuit and/or method with reduced jitter are desired.

BRIEF DESCRIPTION OF THE DRAWINGS

Reference is now made to the following descriptions taken in conjunction with the accompanying drawings, in which.

DETAILED DESCRIPTION

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

Figure 1:
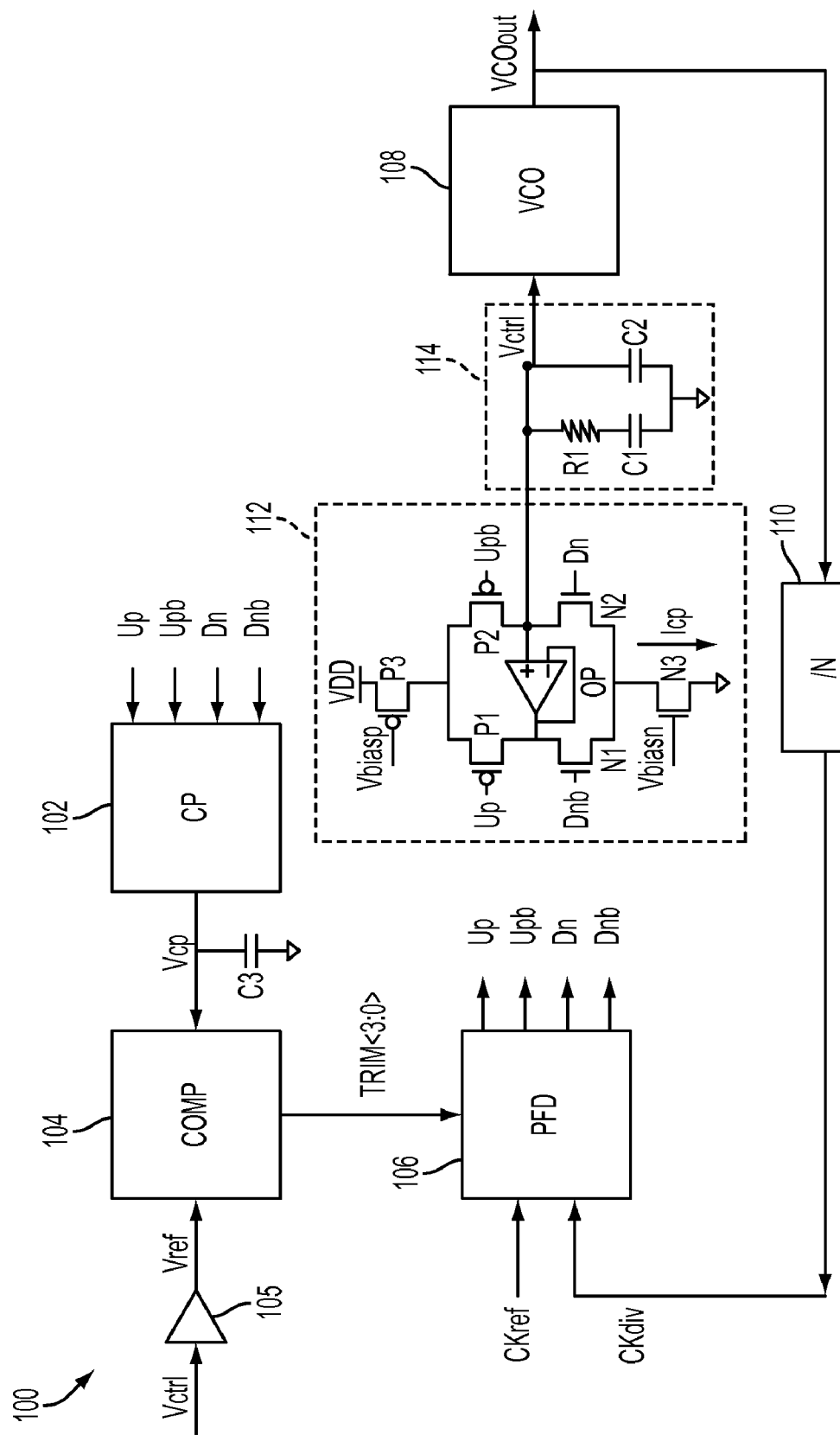
FIG. 1 is a schematic diagram showing an exemplary phase locked loop (PLL) according to some embodiments.

FIG. 1 is a schematic diagram showing an exemplary phase locked loop (PLL) according to some embodiments. The PLL 100 includes two charge pumps 102 and 112, a comparator 104, a phase frequency detector (PFD) 106, a voltage controlled oscillator (VCO) 108, and a frequency divider 110. The VCO supplies an output signal VCOout. The PFD 106 receives a reference frequency signal CKref and provides a first control signal for the first charge pump 112. In this example, the first control signal includes Up, Dn, Upb (complement of Up signal), Dnb (complement of Dn signal). The Up signal is used for increasing a VCOout frequency, and a Dn (i.e., down) signal for decreasing the VCOout frequency.

The first charge pump 112 includes PMOS transistors P1, P2, and P3, NMOS transistors N1, N2, and N3, and an op-amp OP. The PMOS transistors P1 and P2 respectively received the Up and Upb signals at the gates. The NMOS transistors N1 and N2 respectively received the Dnb and Dn signals at the gates. The PMOS transistor P3 and NMOS transistor N3, controlled respectively by voltages Vbiasp and Vbiasn, sets a current Icp. The first charge pump 112 is known in the art and there can be many other implementations of the first charge pump 112.

The first charge pump 112 receives the first control signal (i.e., Up, Dn, Upb, and Dnb), and provides a first voltage signal Vctrl in order to control the VCO 108. A loop filter 114 is coupled between the first charge pump 112 and the VCO 108 to provide filtering of Vctrl. In this example, the loop filter 114 is a low pass filter (LPF) including a resistor R1 and capacitors C1 and C2. The frequency divider (/N) 110 is coupled between the VCO and the PFD. The frequency divider 110 divides the VCOout frequency by a number N and supplies the divided VCOout signal CKdiv to the PFD 106.

The PFD 106 provides the first control signal based on the CKref and CKdiv. For example, if CKdiv is at a lower frequency than CKref, the PFD 106 can provide an Up signal pulse with wider width than the Dn signal pulse to increase Vctrl, which increases VCOout frequency. On the other hand, if CKdiv is at a higher frequency than CKref, the PFD 106 can provide an Up signal pulse with narrower width than the Dn signal pulse to increase Vctrl, which increases VCOout frequency. If the CKref matches CKdiv, then the Up signal and Dn signal have the same short pulse width in one embodiment. In other embodiments, a different first control signal can be used for different implementations of the charge pump 112.

A second charge pump 102 also receives the first control signal, e.g., Up, Dn, Upb, Dnb, and provides a second voltage signal Vcp for a comparator 104. A capacitor C3 having a smaller value less than C2 (e.g., 1/10 of C2) is coupled to the second charge pump 102 for faster signal feedback. The comparator 104 receives a reference voltage signal Vref (from Vctrl through a buffer 105) and compares with Vcp, and provides a second control signal Trim. In this example, the Trim is a 4 bit signal. The PFD 106 adjusts at least one side slope of the first control signal based on the second control signal Trim, in order to fine tune the Vctrl and thus the VCOout frequency.

For example, if Vcp is higher than Vref, the second control signal Trim is provided so that the PFD 106 will provide the Dn signal pulse with increased rising slope to decrease Vctrl, which decreases VCOout frequency. If Vcp is lower than Vref, the second control signal Trim is provided so that the PFD 106 will provide the Dn signal pulse with decreased rising slope to increase Vctrl, which increases VCOout frequency. Vref is supplied from Vctrl through the buffer 105.

Using the feedback to the PFD 106 from the second charge pump 102 and the comparator 104, the VCOout signal's jitter is reduced due to better control of Vctrl with the fine tuning of the first control signal (e.g., Up, Upb, Dn, and Dnb). Exemplary implementations of slope adjustment circuits for the first control signal, e.g., the rising slope of Dn, are described below in FIG. 2A and FIG. 2B.

In other embodiments, a different side slope of the first control signal can be adjusted. For example, the falling slope of the Dn signal, or the rising or falling slope of the Up signal can be adjusted to control Vctrl.

Figure 2A:
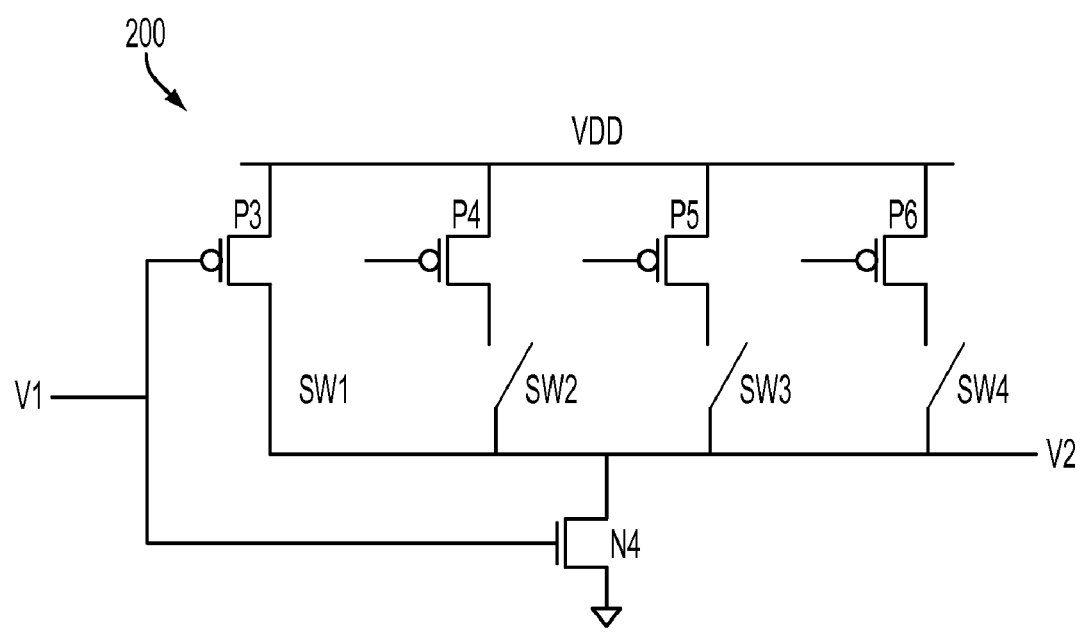
FIG. 2A is a schematic diagram showing an exemplary signal slope adjustment circuit for the phase locked loop (PLL) in FIG. 1 according to some embodiments.

FIG. 2A is a schematic diagram showing an exemplary signal slope adjustment circuit for the phase locked loop (PLL) in FIG. 1 according to some embodiments. In this example, the circuit 200 has an inverter structure using PMOS transistors P3, P4, P5, and P6 for a pull-up circuit and an NMOS transistor N4 for a pull-down circuit. The circuit 200 is the output stage of PFD 106, e.g., that supplies the Dn signal. Switches SW1, SW2, SW3, and SW4 are respectively coupled to the PMOS transistors P3, P4, P5, and P6.

When an input voltage V1 to the circuit 200 in the PFD 106 is low, at least one of PMOS transistors P3, P4, P5, and P6 are connected to the output voltage V2, e.g., the Dn signal, depending on the status of switches SW1, SW2, SW3, and SW4 (assuming at least one of switches SW1, SW2, SW3, and SW4 is turned on). By changing which one or more of the PMOS transistors P3, P4, P5, and P6 are connected to the V2, the current capacity of the pull-up operation is varied, which results in different rising slope of V2. For example, if a larger PMOS transistor is connected to V2, the rising slope is increased compared to a smaller PMOS transistor. Or if multiple PMOS transistors are connected to V2, the rising slope is increased compared to when only one of the PMOS transistors is connected (for the same size PMOS transistors).

Figure 2B:
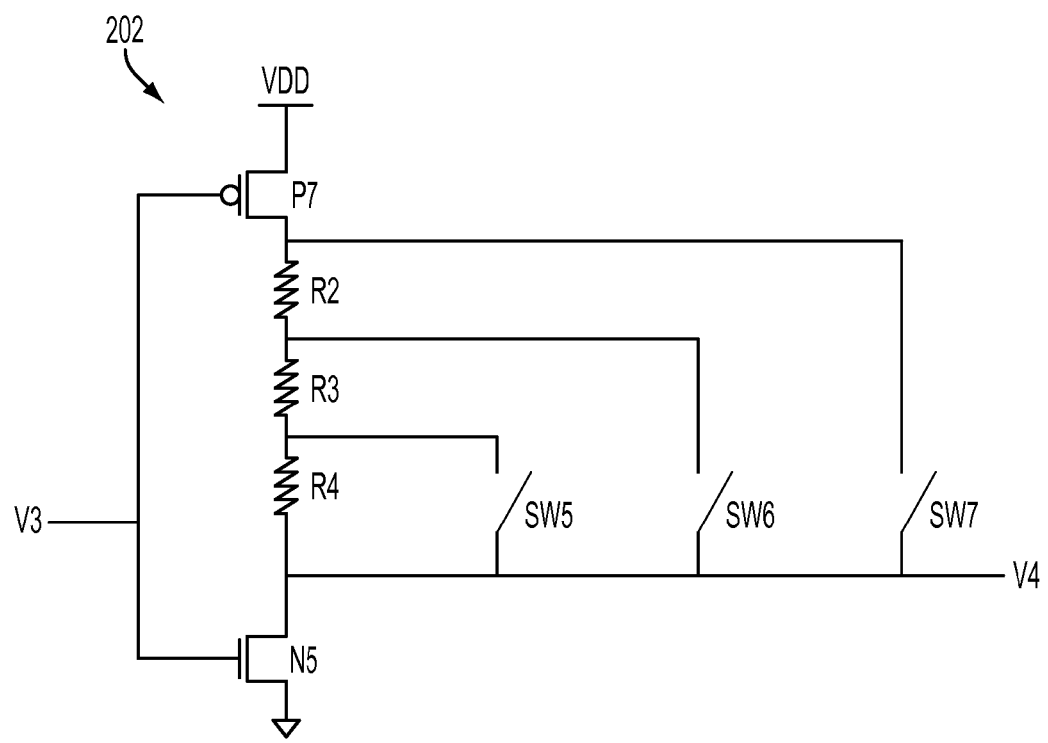
FIG. 2B is a schematic diagram showing another exemplary signal slope adjustment circuit for the phase locked loop (PLL) in FIG. 1 according to some embodiments.

FIG. 2B is a schematic diagram showing another exemplary signal slope adjustment circuit for the phase locked loop (PLL) in FIG. 1 according to some embodiments. In this example, the circuit 202 has an inverter structure using a PMOS transistor P7 for a pull-up circuit and an NMOS transistor N5 for a pull-down circuit. The circuit 202 is the output stage of PFD 106, e.g., that supplies the Dn signal. Switches SW5, SW6, and SW7 are selectively turned on to adjust the resistance between the PMOS transistor P7 and an output V4, e.g., the Dn signal. In this example, the current capacity of the pull-up circuit is adjusted by tuning the resistance coupled to the pull-up PMOS transistor P7.

For example, if all switches SW5, SW6, and SW7 are turned off, the effective resistance between the PMOS transistor P7 and V4 is all of R2, R3, and R4 in series. If only the switch SW5 is turned on, then the effective resistance between the PMOS transistor P7 and V4 is R2 and R3 in series. If only the switch SW6 is turned on, then the effective resistance between the PMOS transistor P7 and V4 is R2. If only the switch SW7 is turned on, then the effective resistance between the PMOS transistor P7 and V4 has none of R2, R3, and R4. With more resistance between the PMOS transistor P7 and V4, the rising slope at V4 is decreased. With less resistance between the PMOS transistor P7 and V4, the rising slope at V4 is increased.

Figure 3:
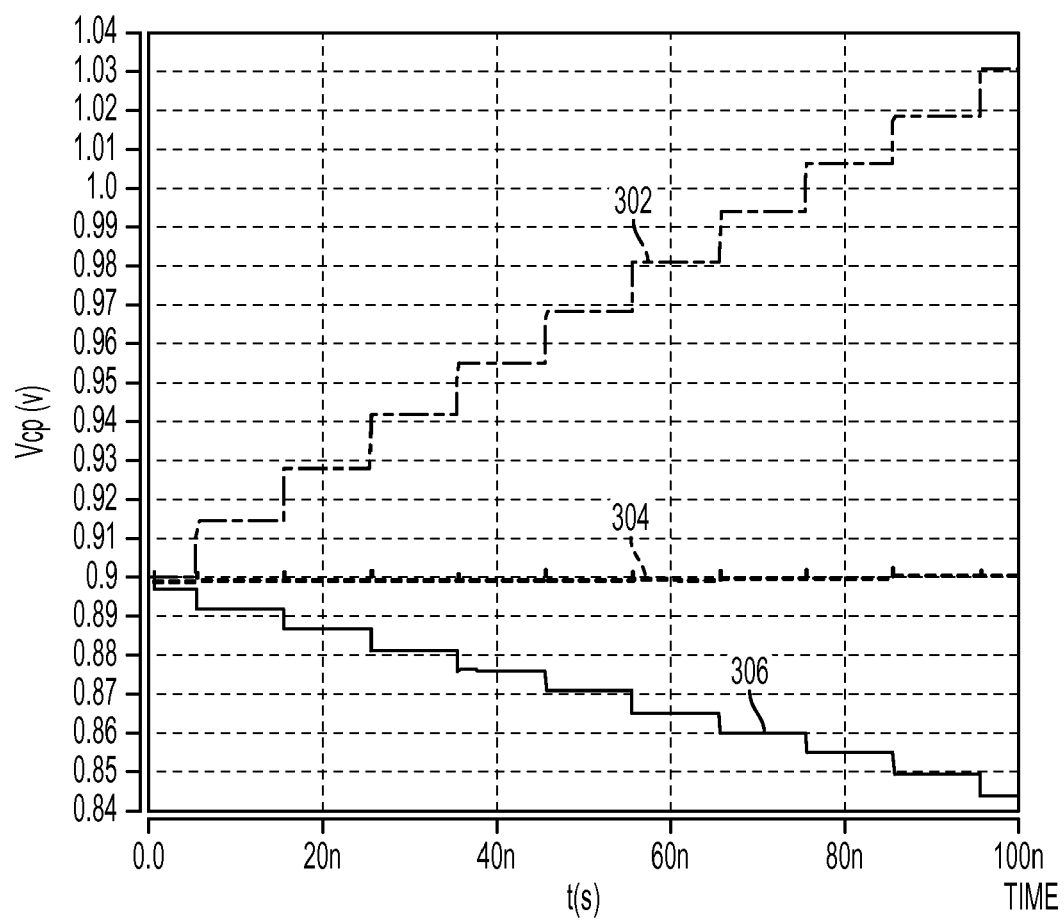
FIG. 3 is a plot showing Vcp waveforms of the exemplary phase locked loop (PLL) in FIG. 1 according to some embodiments.

FIG. 3 is a plot showing Vcp waveforms of the exemplary phase locked loop (PLL) in FIG. 1 according to some embodiments. The waveform 304 shows Vcp from the second charge pump 102 when the current capacity of the pull-up PMOS transistor for the Dn signal is set (e.g., in FIG. 2A), so that Vcp remains relatively constant. The waveform 302 shows Vcp from the second charge pump 102 when the current capacity of the pull-up PMOS transistor for the Dn signal is decreased (i.e., the PMOS transistor width parameter is reduced 0.6 times). The Vcp is increased each time the Dn signal pulse is provided from PFD 106 (due to the decreased rising slope of the Dn signal). The waveform 306 shows Vcp from the second charge pump 102 when the current capacity of the pull-up PMOS transistor for the Dn signal is increased (i.e., the PMOS transistor width parameter is increased 2 times). The Vcp is decreased each time the Dn signal pulse is provided from PFD 106 (due to the increased rising slope of the Dn signal). Thus, FIG. 3 illustrates that by changing the current capacity of the pull-up circuit for the first control signal, e.g., the Dn signal, the Vcp from the second charge pump 102 is affected in accordance (thus the first control signal, e.g., the Dn signal is indeed adjusted).

Figure 4:
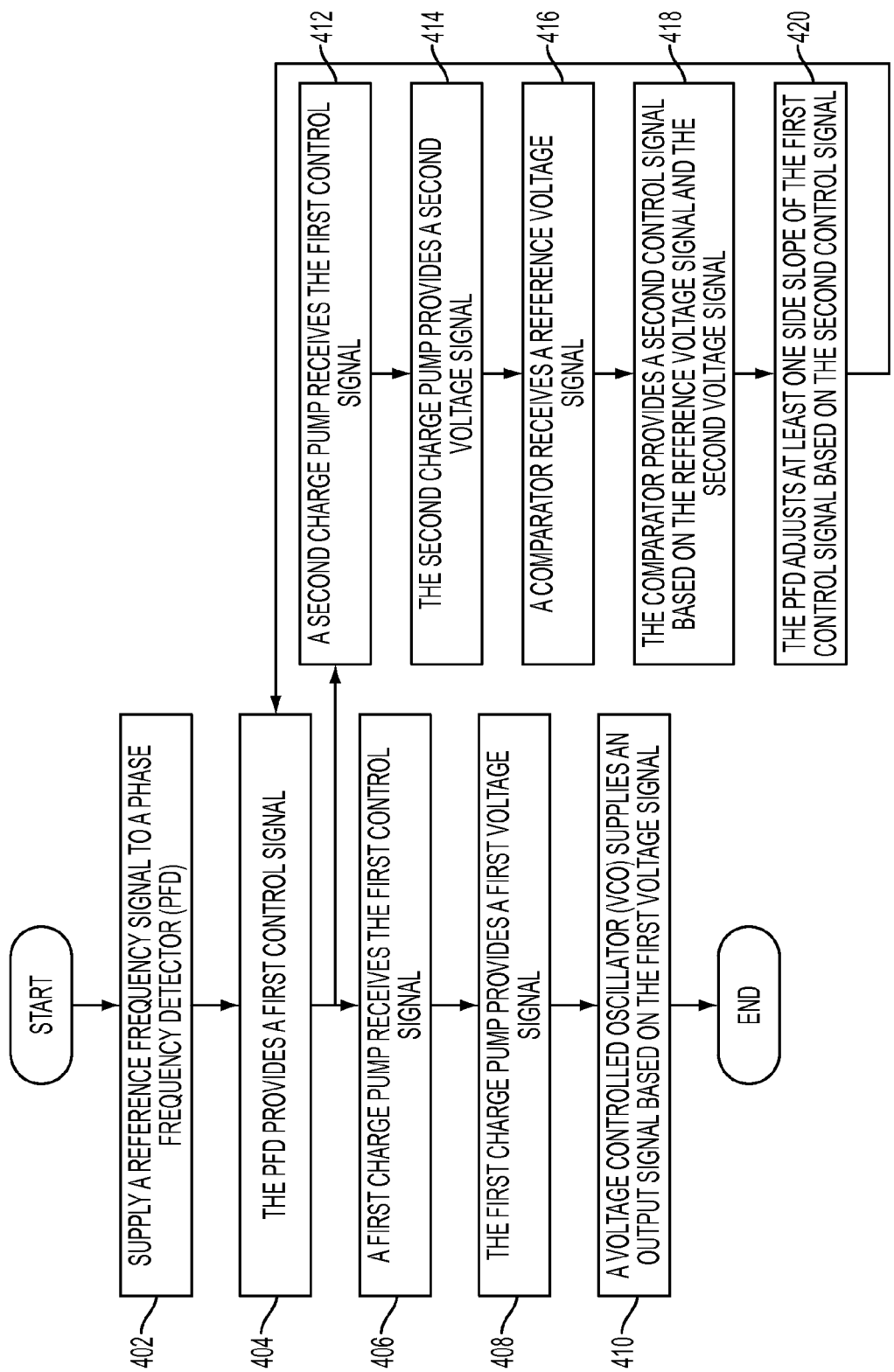
FIG. 4 is a flowchart of a method for the exemplary phase locked loop (PLL) in FIG. 1 according to some embodiments.

FIG. 4 is a flowchart of a method for the exemplary phase locked loop (PLL) in FIG. 1 according to some embodiments. At step 402, a reference frequency signal is supplied to a phase frequency detector (PFD). At step 404, the PFD provides a first control signal. At step 406, a first charge pump receives the first control signal. At step 408, the first charge pump provides a first voltage signal. At step 410, a voltage controlled oscillator (VCO) supplies an output signal based on the first voltage signal.

In parallel with the above mechanism, steps 412, 414, 416, 148, and 420 provides feedback to PFD as the following. At step 412, a second charge pump receives the first control signal. At step 414, the second charge pump provides a second voltage signal. At step 416, a comparator receives a reference voltage signal. At step 418, the comparator provides a second control signal (as a feedback signal to the PFD) based on the reference voltage signal and the second voltage signal. At step 420, the PFD adjusts at least one side slope of the first control signal based on the second control signal.

In various embodiments, the first voltage signal is filtered. The filtered first voltage signal is supplied to the VCO. The filtering is performed utilizing a low pass filter. A feedback signal from the output signal is coupled to the PFD. The PFD compares the feedback signal and the reference frequency signal. A frequency of the output signal from the VCO is divided by a frequency divider. The divided output signal is supplied to the PFD.

In various embodiments, the first control signal comprises an up signal for increasing a VCO frequency of the output signal, and a down signal for decreasing the VCO frequency of the output signal, and the PFD adjusts a rising slope of the down signal.

According to some embodiments, a phase locked loop (PLL) includes a voltage controlled oscillator (VCO) configured to supply an output signal. A phase frequency detector (PFD) is configured to receive a reference frequency signal and to provide a first control signal. A first charge pump is configured to receive the first control signal and to provide a first voltage signal in order to control the VCO. A second charge pump is configured to receive the first control signal and to provide a second voltage signal. A comparator is configured to receive a reference voltage signal, to compare the reference voltage signal and the second voltage signal, and to provide a second control signal. The PFD is configured to adjust at least one side slope of the first control signal based on the second control signal.

According to some embodiments, a method for a phase locked loop (PLL) includes supplying a reference frequency signal to a phase frequency detector (PFD). The PFD provides a first control signal. A first charge pump receives the first control signal. The first charge pump provides a first voltage signal. A second charge pump receives the first control signal. The second charge pump provides a second voltage signal. A comparator receives a reference voltage signal. The comparator provides a second control signal based on the reference voltage signal and the second voltage signal. The PFD adjusts at least one side slope of the first control signal based on the second control signal. A voltage controlled oscillator (VCO) supplies an output signal based on the first voltage signal.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within scope of the disclosure and will be apparent to those skilled in the art after reviewing this disclosure.

What is claimed is:

1. A phase locked loop (PLL), comprising:
   a voltage controlled oscillator (VCO) configured to supply an output signal;
   a phase frequency detector (PFD) configured to receive a reference frequency signal and to provide a first control signal;
   a first charge pump configured to receive the first control signal and to provide a first voltage signal in order to control the VCO;
   a second charge pump configured to receive the first control signal and to provide a second voltage signal; and
   a comparator configured to receive a reference voltage signal, to compare the reference voltage signal and the second voltage signal, and to provide a second control signal,
   wherein the PFD is configured to adjust at least one side slope of the first control signal based on the second control signal.

2. The PLL of claim 1, further comprising a loop filter coupled between the first charge pump and the VCO.

3. The PLL of claim 2, wherein the loop filter is a low pass filter.

4. The PLL of claim 1, further comprising a frequency divider coupled between the VCO and the PFD.

5. The PLL of claim 1, wherein the first control signal comprises an up signal for increasing a VCO frequency of the output signal, and a down signal for decreasing the VCO frequency of the output signal.

6. The PLL of claim 5, wherein the PFD is configured to change a rising slope of the down signal based on the second control signal.

7. The PLL of claim 6, wherein the down signal is supplied through an inverter.

8. The PLL of claim 6, wherein the rising slope of the down signal is adjusted by adjusting a current capacity of a pull-up circuit.

9. The PLL of claim 8, wherein the pull-up circuit comprises a PMOS transistor and the current capacity of the pull-up circuit is adjusted by tuning a resistance coupled to the pull-up PMOS transistor.

10. The PLL of claim 8, wherein the pull-up circuit comprises at least two parallel PMOS transistors and the current capacity of the pull-up circuit is adjusted by selectively enabling the at least two parallel PMOS transistors.

11. A method for a phase locked loop (PLL), comprising:
    supplying a reference frequency signal to a phase frequency detector (PFD);
    the PFD providing a first control signal;
    a first charge pump receiving the first control signal;
    the first charge pump providing a first voltage signal;
    a second charge pump receiving the first control signal;
    the second charge pump providing a second voltage signal;
    a comparator receiving a reference voltage signal;
    the comparator providing a second control signal based on the reference voltage signal and the second voltage signal;
    the PFD adjusting at least one side slope of the first control signal based on the second control signal; and
    a voltage controlled oscillator (VCO) supplying an output signal based on the first voltage signal.

12. The method of claim 11, further comprising filtering the first voltage signal.

13. The method of claim 12, further comprising supplying the filtered first voltage signal to the VCO.

14. The method of claim 12, wherein the filtering is performed utilizing a low pass filter.

15. The method of claim 11, further comprising coupling a feedback signal from the output signal to the PFD.

16. The method of claim 15, further comprising the PFD comparing the feedback signal and the reference frequency signal.

17. The method of claim 11, further comprising dividing a frequency of the output signal from the VCO by a frequency divider.

18. The method of claim 17, further comprising supplying the divided output signal to the PFD.

19. The method of claim 11, wherein the first control signal comprises an up signal for increasing a VCO frequency of the output signal, and a down signal for decreasing the VCO frequency of the output signal, and the at least one side slope of the first control signal is a rising slope of the down signal.

20. A phase locked loop (PLL), comprising:
    a voltage controlled oscillator (VCO) configured to supply an output signal;
    a phase frequency detector (PFD) configured to receive a reference frequency signal and to provide a first control signal;
    a frequency divider arranged to receive the output signal of the VCO and coupled to the PFD;
    a first charge pump configured to receive the first control signal and to provide a first voltage signal in order to control the VCO;
    a second charge pump configured to receive the first control signal and to provide a second voltage signal;
    a low pass filter coupled between the first charge pump and the VCO; and
    a comparator configured to receive a reference voltage signal, to compare the reference voltage signal and the second voltage signal, and to provide a second control signal,
    wherein the PFD is configured to adjust at least one side slope of the first control signal based on the second control signal.

* * * * *